United States Patent
Lee et al.

(10) Patent No.: US 10,662,528 B2
(45) Date of Patent: May 26, 2020

(54) SUBSTRATE PROCESSING APPARATUS AND SUBSTRATE PROCESSING METHOD USING THE SAME

(71) Applicant: WONIK IPS CO., LTD., Pyeongtaek-si, Gyeonggi-do (KR)

(72) Inventors: Jeong Min Lee, Goyang-si (KR); Jin Pil Heo, Pyeongtaek-si (KR); Tae Ho Jeon, Pyeongtaek-si (KR); Seung Han Lee, Osan-si (KR); Byoung Guk Son, Osan-si (KR)

(73) Assignee: WONIK IPS CO., LTD., Pyeongtaek-si, Gyeonggi-do (KR)

(*) Notice: Subject to any disclaimer, the term of this patent is extended or adjusted under 35 U.S.C. 154(b) by 0 days.

(21) Appl. No.: 15/838,517

(22) Filed: Dec. 12, 2017

(65) Prior Publication Data
US 2018/0163303 A1 Jun. 14, 2018

(30) Foreign Application Priority Data

Dec. 13, 2016 (KR) .................. 10-2016-0169968

(51) Int. Cl.
| | | |
|---|---|---|
| C23C 16/44 | (2006.01) | |
| C23C 16/455 | (2006.01) | |
| H01L 21/02 | (2006.01) | |

(52) U.S. Cl.
CPC .... *C23C 16/45544* (2013.01); *C23C 16/4412* (2013.01); *C23C 16/455* (2013.01); *H01L 21/0228* (2013.01); *H01L 21/02181* (2013.01); *H01L 21/02183* (2013.01); *H01L 21/02186* (2013.01); *H01L 21/02189* (2013.01)

(58) Field of Classification Search
CPC ........ C23C 16/45525; C23C 16/45544; C23C 16/4412
See application file for complete search history.

(56) References Cited

U.S. PATENT DOCUMENTS

| | | | | |
|---|---|---|---|---|
| 2003/0070609 | A1* | 4/2003 | Campbell | C23C 16/4401 117/104 |
| 2010/0269753 | A1* | 10/2010 | Seeley | B01D 53/32 118/723 R |
| 2012/0152172 | A1* | 6/2012 | Hwang | C23C 16/45551 118/730 |

FOREIGN PATENT DOCUMENTS

| | | |
|---|---|---|
| KR | 100683441 B1 | 2/2007 |
| KR | 1020110024558 A | 3/2011 |

\* cited by examiner

*Primary Examiner* — Elizabeth A Burkhart
(74) *Attorney, Agent, or Firm* — William Park & Associates Ltd.

(57) ABSTRACT

Provided are a substrate processing apparatus and a substrate processing method using the same and, more particularly, a substrate processing apparatus capable of controlling deposition of a reactive-metal-containing precursor in an exhaust line, and a substrate processing method using the same.

11 Claims, 4 Drawing Sheets

SUBSTRATE PROCESSING APPARATUS AND SUBSTRATE PROCESSING METHOD USING THE SAME

CROSS-REFERENCE TO RELATED PATENT APPLICATION

This application claims the benefit of Korean Patent Application No. 10-2016-0169968, filed on Dec. 13, 2016, in the Korean Intellectual Property Office, the disclosure of which is incorporated herein in its entirety by reference.

BACKGROUND

1. Field

The present invention relates to a substrate processing apparatus and a substrate processing method using the same and, more particularly, to a substrate processing apparatus capable of controlling deposition of a reactive-metal-containing precursor in an exhaust line, and a substrate processing method using the same.

2. Description of the Related Technology

In a semiconductor device manufacturing process, a thin film is generally deposited using a chemical vapor deposition (CVD) process or a physical vapor deposition (PVD) process.

A deposition method having excellent step coverage characteristics is required due to increased integration of a semiconductor device, but the CVD and PVD processes do not easily satisfy the requirement. As such, an atomic layer deposition (ALD) process has been proposed as an alternative to the CVD and PVD processes.

However, in the ALD process, a source gas, e.g., a first process gas including a reactive-metal-containing precursor, is deposited in an exhaust line while the source gas is being purged and/or pumped and thus problems such as pump overload and frequent replacement of a pump line are caused.

Therefore, a technical solution for solving problems due to deposition of a source gas in an exhaust line in an ALD process, e.g., pump overload and frequent replacement of a pump line, is necessary.

SUMMARY

The present invention provides a substrate processing apparatus capable of solving problems due to deposition of a first process gas including a reactive-metal-containing precursor, in an exhaust line, and a substrate processing method using the same.

However, the scope of the present invention is not limited thereto.

According to an aspect of the present invention, there is provided a substrate processing apparatus.

The substrate processing apparatus may include a process chamber in which a process space is provided and including a susceptor on which at least one substrate is placed, a process gas sprayer for providing a first process gas including a reactive-metal-containing precursor and a second process gas including a reactive gas reacting with the first process gas, onto the substrate, an exhauster including one or more exhaust lines connected to exhaust pumps provided outside the process chamber to discharge the first and second process gases remaining in the process chamber, and a reaction gas generator for supplying the second process gas to the process gas sprayer and supplying the second process gas to at least one of the one or more exhaust lines to prevent deposition of the first process gas in the one or more exhaust lines.

The susceptor may be configured such that a plurality of substrates are placed on the susceptor and may rotate relatively to the process gas sprayer, the process gas sprayer may be configured as a process gas sprayer assembly including a first process gas sprayer for providing the first process gas onto the plurality of substrates and a second process gas sprayer for providing the second process gas, the exhauster may include a first exhaust line provided below a first process gas spray area and connected to a first exhaust pump provided outside the process chamber to discharge the first process gas, and a second exhaust line provided below a second process gas spray area and connected to a second exhaust pump provided outside the process chamber to discharge the second process gas, and the reaction gas generator may supply the second process gas to the second process gas sprayer and supply the second process gas to the first exhaust line to prevent deposition of the first process gas in the first exhaust line.

For example, the first process gas may include any gas selected from the group consisting of hafnium (Hf), zirconium (Zr), titanium (Ti), and tantalum (Ta).

For example, the second process gas may include ozone ($O_3$) gas.

The reaction gas generator may include, for example, a first supply line for supplying the second process gas to the process gas sprayer, and a second supply line for supplying the second process gas to the exhaust lines.

The reaction gas generator may include, for example, a first reaction gas generator for supplying the second process gas to the process gas sprayer, and a second reaction gas generator for supplying the second process gas to the exhaust lines.

The substrate processing apparatus may further include a controller for controlling a supply condition including a time and content for providing the second process gas supplied from the reaction gas generator, into the exhaust lines, based on a process condition.

According to another aspect of the present invention, there is provided a substrate processing method.

The substrate processing method may use the above-described substrate processing apparatus and include the steps of: depositing a thin film using the first process gas including a reactive-metal-containing precursor and the second process gas, and supplying the second process gas to at least one of the exhaust lines of the substrate processing apparatus.

The depositing of the thin film may include stabilizing a process condition, and the supplying of the second process gas may include supplying the second process gas to at least one of the exhaust lines during the stabilizing of the process condition.

The depositing of the thin film may include at least one unit cycle including a first operation for providing the first process gas onto the substrate, and a second operation for providing the second process gas onto the substrate.

For example, the unit cycle may further include a purging and/or pumping operation for removing the first and second process gases remaining in the process chamber, and the supplying of the second process gas may include supplying the second process gas to at least one of the exhaust lines during the purging and/or pumping operation.

The supplying of the second process gas may be performed in an operation other than the depositing of the thin film.

BRIEF DESCRIPTION OF THE DRAWINGS

The above and other features and advantages of the present invention will become more apparent by describing in detail embodiments thereof with reference to the attached drawings in which.

DETAILED DESCRIPTION

Figure 1:
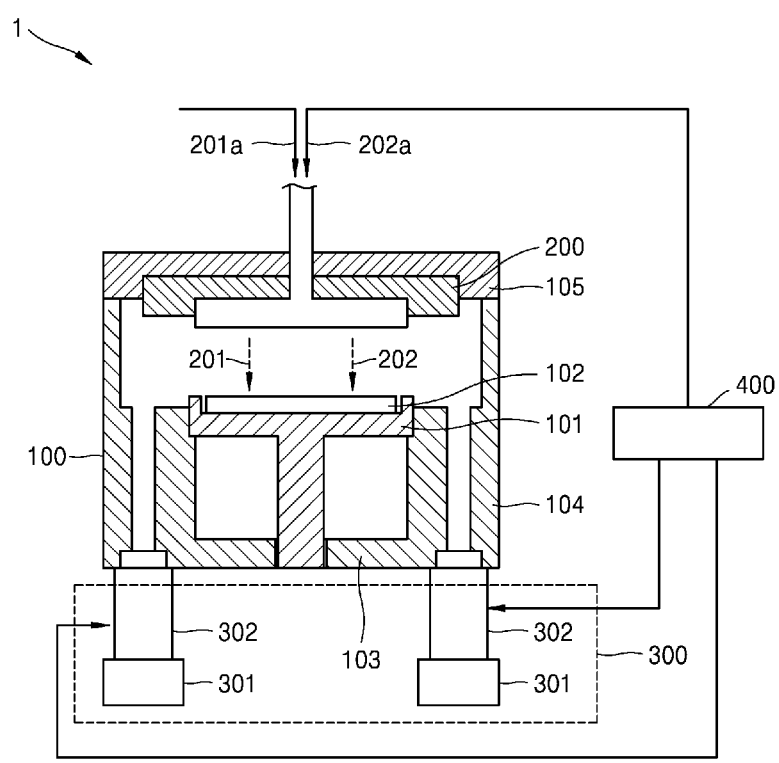
FIGS. 1 to 3 are cross-sectional diagrams of a substrate processing apparatus according to an embodiment of the present invention.

Hereinafter, the present invention will be described in detail by explaining embodiments of the invention with reference to the attached drawings.

It will be understood that when an element, such as a layer, a region, or a substrate, is referred to as being "on" another element, it may be directly on the other element or intervening elements may be present. In contrast, when an element is referred to as being "directly on" another element, there are no intervening elements present. For example, when a thin film is referred to as being deposited "on" a substrate, a base layer may be or may not be present between the substrate and the thin film.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In the drawings, the thicknesses or sizes of layers may be exaggerated for clarity and convenience of explanation, and like reference numerals denote like elements.

FIG. 1 is a cross-sectional diagram of a substrate processing apparatus 1 according to an embodiment of the present invention.

As illustrated in FIG. 1, the substrate processing apparatus 1 according to an embodiment of the present invention includes a process chamber 100 having a process space therein and including a susceptor 101 configured to place at least one substrate 102 thereon, a process gas sprayer 200 for providing a first process gas 201 including a reactive-metal-containing precursor and a second process gas 202 including a reactive gas reacting with the first process gas 201, onto the substrate 102, an exhauster 300 including one or more exhaust lines 302 connected to exhaust pumps 301 provided outside the process chamber 100 to discharge the first and second process gases 201 and 202 remaining in the process chamber 100, and a reaction gas generator 400 for supplying the second process gas 202 to the process gas sprayer 200 and supplying the second process gas 202 to at least one of the exhaust lines 302 to prevent deposition of the first process gas 201 in the exhaust lines 302.

Figure 2:
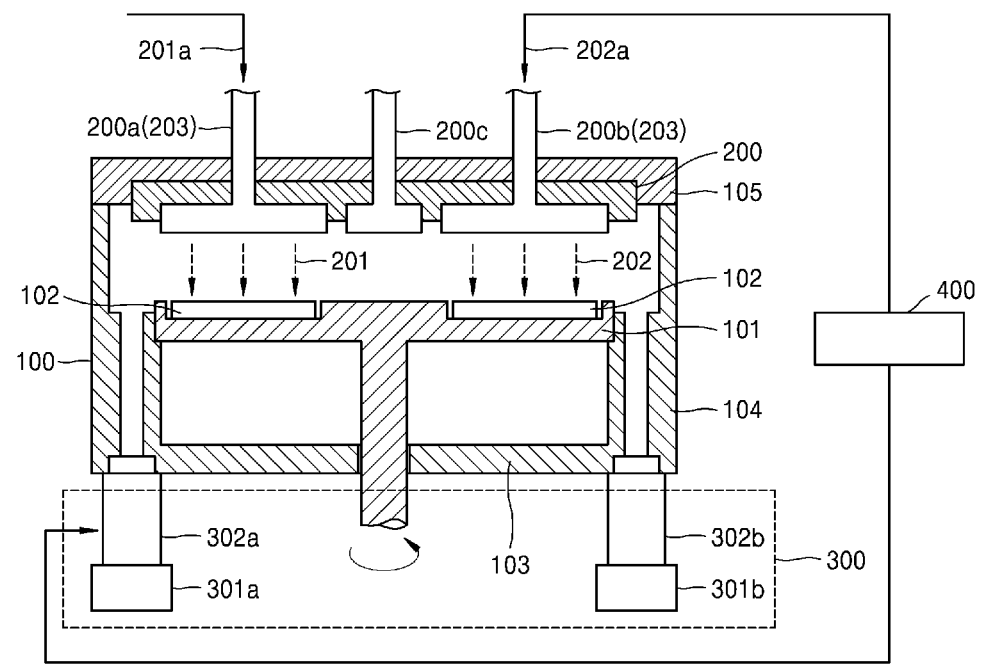

The process gas sprayer 200 may have a structure in which the above-described first and second process gases 201 and 202 are provided onto the substrate 102 from a single shower head, or have a structure in which the first and second process gases 201 and 202 are provided from a first process gas sprayer 200a and a second process gas sprayer 200b onto the substrate 102 as illustrated in FIG. 2. It should be understood that the process gas sprayer 200 illustrated in FIG. 1 includes both of the two structures.

Although the exhauster 300 of the substrate processing apparatus 1 includes two exhaust lines 302 and two exhaust pumps 301 in FIG. 1, the exhaust lines 302 and the exhaust pumps 301 included in the exhauster 300 may vary based on a process condition and it should be understood that the substrate processing apparatus 1 of FIG. 1 includes all structures including one or more exhaust lines 302 and one or more exhaust pumps 301.

In addition, although the substrate processing apparatus 1 illustrated in FIG. 1 includes one reaction gas generator 400, the reaction gas generator 400 according to the present invention may be configured as a first reaction gas generator or may include first and second reaction gas generators, and thus it should be understood that the substrate processing apparatus 1 illustrated in FIG. 1 includes both of the two structures.

The substrate processing apparatus 1 configured as illustrated in FIG. 1 may effectively prevent deposition of the first process gas 201 in the exhaust lines 302 for discharging the first process gas 201 remaining in the process chamber 100. As such, ultimately, pump overload may be prevented and process restrictions due to frequent replacement of a pump line may be solved.

The substrate processing apparatus 1 according to an embodiment of the present invention includes the process chamber 100. The process chamber 100 serves as a reactor in which reaction occurs, and includes the susceptor 101 configured to place the substrate 102 thereon.

The susceptor 101 may serve as a table for stably supporting the substrate 102 during a substrate deposition process. In addition, the susceptor 101 may include a heater therein or thereunder to serve as a thermostat for depositing a thin film on the substrate 102 to an appropriate thickness.

The first process gas 201 including a reactive-metal-containing precursor and the second process gas 202 reacting with the first process gas 201 to deposit a thin film are provided onto the substrate 102. Thus, the substrate 102 is not limited to any particular type and the substrate processing apparatus 1 may use a variety of well-known substrates without restriction in the present invention.

For example, the substrate 102 may be a stepped structure including a via, hole, or trench structure, but is not limited thereto.

The susceptor 101 and the substrate 102 may be included in, for example, a substrate supporter, and one or more susceptors 101 and one or more substrates 102 may be included in the substrate supporter.

Particularly, since the substrate processing apparatus 1 according to the present invention is applicable to both of time-division and space-division deposition methods, one substrate 102 or a plurality of substrates 102 may be provided in the process chamber 100.

For example, one substrate 102 may be provided on the susceptor 101 and, in this case, the substrate processing apparatus 1 may be used for a time-division deposition method or a space-division deposition method.

As another example, a plurality of substrates 102 may be provided on the susceptor 101 and, in this case, the susceptor 101 and the substrate 102 may be located in a predetermined area on the substrate supporter including the susceptor 101.

Specifically, the substrate supporter may be equally divided into sub areas and the susceptor 101 and the substrate 102 placed on the susceptor 101 may be present in each area.

Here, a deposition method using the deposition apparatus illustrated in FIG. 2, e.g., a space-division deposition method for depositing a thin film on the substrates 102 based on relative rotation between the susceptor 101 and the process gas sprayer 200 for providing the first and second process gases 201 and 202 onto the substrates 102, may be employed.

As illustrated in FIG. 1, the process chamber 100 may have a structure capable of blocking entering of external air due to a bottom part 103, an outer wall 104, and a top plate 105.

Therefore, a thin film deposition process in the process chamber 100 may be performed in a thin film deposition space between the process gas sprayer 200 located near the top plate 105, and the substrate 102.

A substrate transfer slot (not shown) through which the substrate 102 is loaded or unloaded may be provided in the outer wall 104.

The exhaust lines 302 and the exhaust pumps 301 for discharging the first and second process gases 201 and 202 remaining in the process chamber 100 may be located under the bottom part 103.

The substrate processing apparatus 1 of FIG. 1 according to an embodiment of the present invention includes the process gas sprayer 200. The process gas sprayer 200 provides the first process gas 201 including a reactive-metal-containing precursor and the second process gas 202 including a reactive gas, onto the substrate 102.

The process gas sprayer 200 serves to provide process gases for depositing a thin film on the substrate 102, e.g., a source gas such as the first process gas 201 including a reactive-metal-containing precursor and a reaction gas such as the second process gas 202, and may be located near the top plate 105 of the process chamber 100 to supply the gases into the process chamber 100.

The first process gas 201 including a reactive-metal-containing precursor may refer to a gas capable of depositing an atomic layer or a thin film of a predetermined thickness on the substrate 102 through reaction with a reaction gas such as the second process gas 202.

For example, the first process gas 201 including a reactive-metal-containing precursor may include any gas selected from the group consisting of hafnium (Hf), zirconium (Zr), titanium (Ti), and tantalum (Ta), but is not limited thereto.

The second process gas 202 may refer to a gas capable of depositing an atomic layer or a thin film on the substrate 102 through reaction with the above-described first process gas 201, and may be, for example, ozone ($O_3$) gas.

The process gas sprayer 200 may provide a purge gas for purging the first and second process gases 201 and 202 remaining in the process chamber 100.

The purge gas may be an inert gas having no reactivity with the first and second process gases 201 and 202, e.g., nitrogen (N) or argon (Ar) gas.

The process gas sprayer 200 may have a single shower head structure configured as only, for example, a first process gas sprayer. In this case, a first process gas supply line and a second process gas supply line may be connected to the first process gas sprayer.

Alternatively, as illustrated in FIG. 2, the process gas sprayer 200 may include the first and second process gas sprayers 200a and 200b. In this case, a first process gas supply line 201a may be connected to the first process gas sprayer 200a and a second process gas supply line 202a may be connected to the second process gas sprayer 200b in such a manner that the first and second process gases 201 and 202 are provided into the first and second process gas sprayers 200a and 200b, respectively.

Referring back to FIG. 1, the substrate processing apparatus 1 includes the exhauster 300. The exhauster 300 includes the exhaust lines 302 connected to the exhaust pumps 301 provided outside the process chamber 100.

The exhaust lines 302 may be connected to the process chamber 100 to discharge the first and second process gases 201 and 202 remaining in the process chamber 100.

The exhauster 300 may include, for example, one or more exhaust lines 302 and one or more exhaust pumps 301 to discharge the first and second process gases 201 and 202 through the exhaust lines 302 at the same time or at different times. In this case, the reaction gas generator 400 to be described below may supply the second process gas 202 to the one or more exhaust lines 302 to prevent deposition of the first process gas 201 in the exhaust lines 302.

Alternatively, as illustrated in FIG. 2, the exhauster 300 may include a first exhaust line 302a and a second exhaust line 302b. At this time, the first process gas 201 remaining in the process chamber 100 may be discharged through the first exhaust line 302a, and the second process gas 202 may be discharged through the second exhaust line 302b. In this case, the reaction gas generator 400 to be described below may supply the second process gas 202 to the first exhaust line 302a to prevent deposition of the first process gas 201 in the first exhaust line 302a.

Referring back to FIG. 1, the substrate processing apparatus 1 according to an embodiment of the present invention includes the reaction gas generator 400. The reaction gas generator 400 supplies the second process gas 202 to the process gas sprayer 200, and provides the second process gas 202 to the exhaust lines 302 to prevent deposition of the first process gas 201 in the exhaust lines 302. As described above, by supplying the second process gas 202 generated by the reaction gas generator 400, to the exhaust lines 302, deposition of the first process gas 201 including a reactive-metal-containing precursor, in the exhaust lines 302 may be effectively suppressed.

In the above description, the expression [deposition of the first process gas 201 including a reactive-metal-containing precursor, in the exhaust lines 302] means that a reactive-metal-containing precursor and a foreign substance including the same are generated to a predetermined thickness in the exhaust lines 302. For example, when the exhaust lines 302 have a cylindrical shape, the above expression means that a reactive-metal-containing precursor and a foreign substance including the same are generated on inner circumferential surfaces of the cylindrical exhaust lines 302 to reduce inner diameters of the exhaust lines 302.

The reaction gas generator 400 may be configured as one reaction gas generator or may include two or more reaction gas generators.

Specifically, when the substrate processing apparatus 1 includes the first and second reaction gas generators, the first reaction gas generator may supply the second process gas 202 to the process gas sprayer 200, and the second reaction gas generator may supply the second process gas 202 to the exhaust lines 302.

That is, the reaction gas generator 400 may include, for example, the first reaction gas generator for supplying the second process gas 202 to the process gas sprayer 200, and the second reaction gas generator for supplying the second process gas 202 to the exhaust lines 302.

As described above, when the substrate processing apparatus 1 includes at least two reaction gas generators, the second process gas 202 may be continuously supplied to the exhaust lines 302 irrespective of a process condition. As such, deposition of the first process gas 201 in the exhaust lines 302 may be more effectively controlled.

As another example, when the substrate processing apparatus 1 includes only the first reaction gas generator, the reaction gas generator 400 may supply the second process gas 202 to the process gas sprayer 200 through a first supply line, and supply the second process gas 202 to the exhaust lines 302 through a second supply line.

That is, the reaction gas generator 400 may include, for example, the first supply line for supplying the second process gas 202 to the process gas sprayer 200, and the second supply line for supplying the second process gas 202 to the exhaust lines 302.

The substrate processing apparatus 1 according to an embodiment of the present invention is applicable to both of space-division and time-division deposition processes, and the space-division substrate processing apparatus 1 illustrated in FIG. 2 will now be described in detail.

FIG. 2 illustrates the space-division substrate processing apparatus 1 as an example of the substrate processing apparatus 1 of FIG. 1.

Specifically, referring to FIG. 2, the substrate processing apparatus 1 according to an embodiment of the present invention includes the process chamber 100 including the susceptor 101 configured to place a plurality of substrates 102 thereon, the process gas sprayer 200 rotating relatively to the susceptor 101 and configured as a process gas sprayer assembly 203 including the first process gas sprayer 200a for providing the first process gas 201 onto the plurality of substrates 102 and the second process gas sprayer 200b for providing the second process gas 202, the exhauster 300 including the first exhaust line 302a provided below a first process gas spray area and connected to a first exhaust pump 301a provided outside the process chamber 100 to discharge the first process gas 201, and the second exhaust line 302b provided below a second process gas spray area and connected to a second exhaust pump 301b provided outside the process chamber 100 to discharge the second process gas 202, and the reaction gas generator 400 for supplying the second process gas 202 to the second process gas sprayer 200b and supplying the second process gas 202 to the first exhaust line 302a to prevent deposition of the first process gas 201 in the first exhaust line 302a.

The space-division substrate processing apparatus 1 illustrated in FIG. 2 may deposit a thin film on the substrates 102 based on relative rotation between the process gas sprayer 200 and the susceptor 101 having the plurality of substrates 102 placed thereon.

In the above description, the term [relative rotation] means that at least one of the susceptor 101 and the process gas sprayer 200 rotates relatively to the other in such a manner that the first and second process gases 201 and 202 sprayed from the process gas sprayer 200 are sequentially or simultaneously provided onto any one of the plurality of substrates 102 placed on the susceptor 101.

Specifically, relative rotation between the susceptor 101 and the process gas sprayer 200 means that the substrate supporter including the susceptor 101 or the process gas sprayer 200 rotates in such a manner that the first process gas 201, the purge gas, the second process gas 202, and the purge gas are sequentially provided onto any one of the plurality of substrates 102 placed on the susceptor 101.

As illustrated in FIG. 2, the process gas sprayer 200 of the space-division substrate processing apparatus 1 is configured as the process gas sprayer assembly 203, and the process gas sprayer assembly 203 includes at least two shower heads.

Specifically, the process gas sprayer assembly 203 includes the first process gas sprayer 200a rotating relatively to the susceptor 101 to provide the first process gas 201 onto the plurality of substrates 102, and the second process gas sprayer 200b for providing the second process gas 202.

The first and second process gas sprayers 200a and 200b may be, for example, radially provided along a circumferential direction of the process gas sprayer 200, and a purge gas sprayer (not shown) for providing the purge gas may be located between the first and second process gas sprayers 200a and 200b. The process gas sprayer 200 may further include a central purge gas supplier 200c at a center part thereof.

As described above, when the process gas sprayer 200 is configured as the process gas sprayer assembly 203 including the first and second process gas sprayers 200a and 200b, the first process gas supply line 201a may be connected to the first process gas sprayer 200a and the second process gas supply line 202a may be connected to the second process gas sprayer 200b in such a manner that the first and second process gases 201 and 202 are provided into the first and second process gas sprayers 200a and 200b, respectively.

As illustrated in FIG. 2, the exhauster 300 of the space-division substrate processing apparatus 1 includes the first and second exhaust lines 302a and 302b. The first and second exhaust lines 302a and 302b are located below the first and second process gas spray areas to discharge the first and second process gases 201 and 202 remaining in the process chamber 100, respectively. In this case, the reaction gas generator 400 may supply the second process gas 202 to the first exhaust line 302a and the second process gas sprayer 200b. As such, the second process gas 202 for depositing a thin film on the substrates 102 may be provided into the process chamber 100, and deposition of the first process gas 201 in the first exhaust line 302a may be effectively prevented.

The space-division substrate processing apparatus 1 according to an embodiment of the present invention may include the first and second reaction gas generators, or include only the first reaction gas generator, and a method of supplying the second process gas 202 to the process gas sprayer 200 and the exhaust lines 302 is as described above.

In the substrate processing apparatus 1 according to an embodiment of the present invention, a time, order, etc. for supplying the second process gas 202 to the exhaust lines 302 may vary based on a deposition method, e.g., a time-division or space-division deposition method, and the number of reaction gas generators 400.

In other words, when the reaction gas generator 400 is configured as the first reaction gas generator, since the second process gas 202 is supplied from a single reaction gas generator to the process gas sprayer 200 and to the exhaust lines 302, a stabilization method for preventing non-uniform deposition of a thin film due to reduction in stability of a supply flow rate is required.

Figure 3:
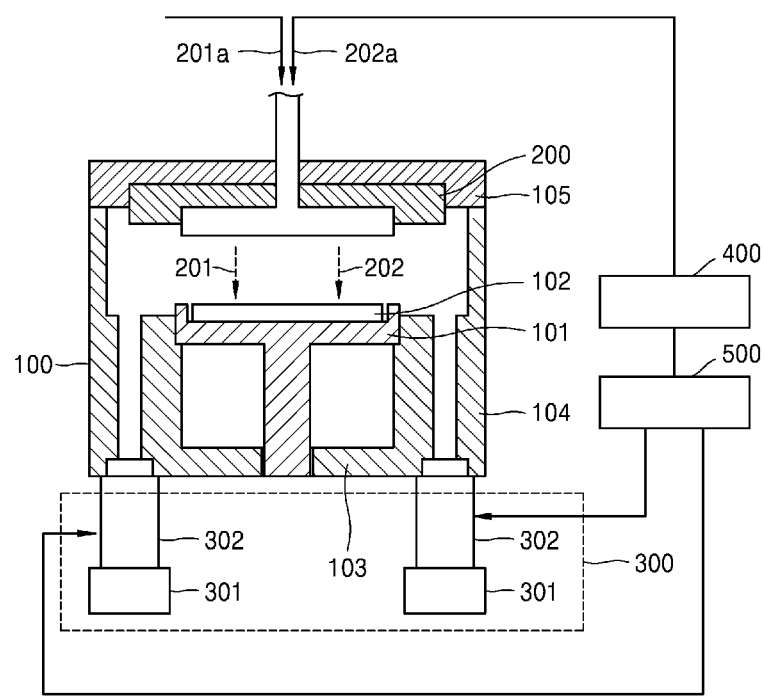

As illustrated in FIG. 3, the substrate processing apparatus 1 according to an embodiment of the present invention may further include a controller 500 for controlling a supply condition including a time and content for providing the second process gas 202 generated by the reaction gas generator 400, into the exhaust lines 302, based on a process condition.

As described above, since a time, content, order, etc. for supplying the second process gas 202 to the exhaust lines 302 may vary based on a process condition included in the substrate processing apparatus 1 according to an embodiment of the present invention, the controller 500 may control the same to effectively achieve the goal of the substrate processing apparatus 1 according to an embodiment of the present invention.

That is, the controller 500 may set an overall operation process of the substrate processing apparatus 1 including the exhaust lines 302 for discharging the first process gas 201 using a pre-programmed device.

Specifically, for example, the controller 500 may perform a process for controlling a supply condition including a time and content for providing the second process gas 202 generated by the reaction gas generator 400, into the exhaust lines 302, based on a process condition such as a time-division deposition process or a space-division deposition process, or the number of reaction gas generators 400.

According to an embodiment of the present invention, due to the above-described configuration of the substrate processing apparatus 1, deposition of the first process gas 201 including a reactive-metal-containing precursor, in the exhaust lines 302 may be suppressed.

The substrate processing apparatus 1 according to an embodiment of the present invention may be a chemical vapor deposition (CVD) apparatus or an apparatus used for atomic layer deposition (ALD).

In addition, the substrate processing apparatus 1 according to an embodiment of the present invention is applicable to both of time-division and space-division substrate processing methods.

Figure 4:
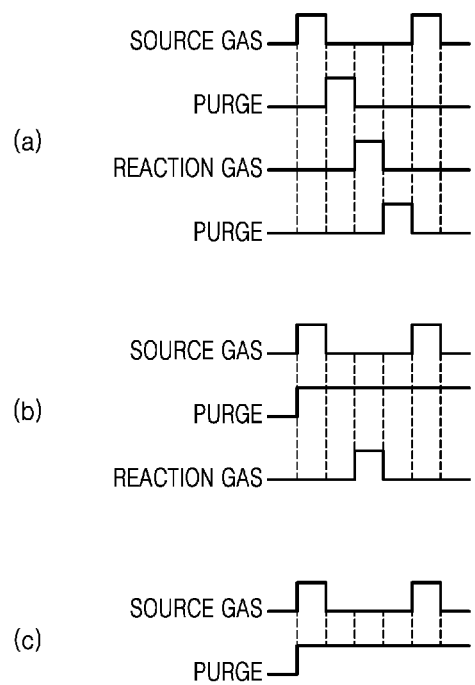
FIG. 4 shows timing diagrams illustrating a time-division substrate processing method according to an embodiment of the present invention.

In this specification, the term [time-division] refers to a method of inducing deposition on a substrate by controlling a supplying, purging, and/or pumping process of a source gas and a reaction gas in a time series manner as shown in FIG. 4.

Figure 5:
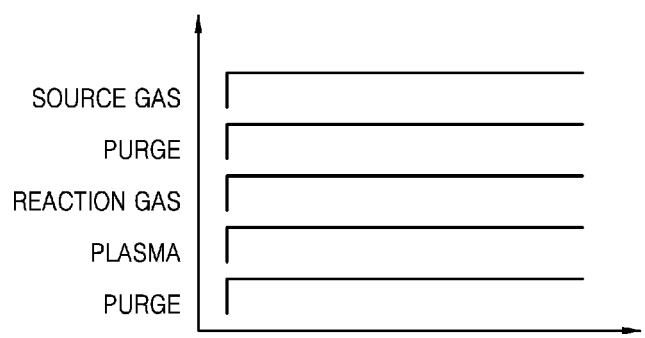
FIG. 5 is a timing diagram showing a space-division substrate processing method according to an embodiment of the present invention.

The term [space-division] refers to a method of supplying a first process gas, a second process gas, and a purge gas as soon as a thin film deposition process is started, and performing the deposition process while moving a substrate placed on a susceptor, as shown in FIG. 5.

In the space-division deposition method, for example, a source gas supply area and a reaction gas supply area may be divided in a process chamber using a space-division purge gas and, at the same time, a source gas and a reaction gas may be deposited while moving a substrate. As another example, a deposition process using first and second process gases and a purging process using a purge gas are performed while a susceptor having a plurality of substrates placed thereon rotates relatively to a process gas sprayer due to acceleration of a substrate supporter.

A substrate processing method according to an embodiment of the present invention uses the substrate processing apparatus 1 and includes depositing a thin film using the first process gas 201 including a reactive-metal-containing precursor, and the second process gas 202, and supplying the second process gas 202 to at least one of the exhaust lines 302 of the substrate processing apparatus 1.

Specifically, the substrate processing method according to an embodiment of the present invention uses the above-described substrate processing apparatus 1 and includes supplying the second process gas 202 to the exhaust lines 302 of the substrate processing apparatus 1, thereby controlling deposition of the first process gas 201 in the exhaust lines 302.

The substrate processing method may further include stabilizing a process condition, before the depositing of the thin film.

The stabilizing of the process condition includes, for example, stabilizing flow rates, speeds, or pressures of the first and second process gases 201 and 202 or stabilizing temperature of the substrate 102 before the depositing of the thin film is started, thereby achieving process stability, e.g., uniform thickness of the thin film deposited on the substrate 102 and stable deposition of the thin film.

After the stabilizing of the process condition, the depositing of the thin film may be performed as a main process. The depositing of the thin film includes depositing the thin film using the first and second process gases 201 and 202. In an embodiment of the present invention, the supplying of the second process gas 202 to at least one of the exhaust lines 302 may include supplying the second process gas 202 to at least one of the exhaust lines 302 during the stabilizing of the process condition.

The substrate processing method according to an embodiment of the present invention may be a CVD or ALD method and, more particularly, an ALD method.

Accordingly, the depositing of the thin film may include, for example, at least one unit cycle including a first operation for providing the first process gas 201 including a reactive-metal-containing precursor, onto the substrate 102, and a second operation for providing the second process gas 202 onto the substrate 102. The unit cycle may be repeatedly performed, for example, until the thin film is deposited to a desired thickness.

The first operation may be performed by providing the first process gas 201 from the process gas sprayer 200 onto the substrate 102, and the second operation may be performed by providing the second process gas 202 from the process gas sprayer 200 onto the substrate 102.

The unit cycle may further include a purging and/or pumping operation for removing the first and second process gases 201 and 202 remaining in the process chamber 100.

A time or the number of times for performing the purging and/or pumping operation may vary based on a thin film deposition method, e.g., a space-division deposition method or a time-division deposition method.

For example, the purging and/or pumping operation may be performed simultaneously with the first operation, between the first and second operations, or after the second operation of the depositing of the thin film.

Specifically, for example, the purging and/or pumping operation may include a first purging and/or pumping operation for removing the first process gas 201 remaining in the process chamber 100 after the first operation and before the second operation, and a second purging and/or pumping operation for removing the second process gas 202 remaining in the process chamber 100 after the second operation.

As another example, the purging and/or pumping operation may be performed simultaneously with the first operation and continued until the thin film is completely deposited.

In addition, the purging and/or pumping operation may be performed to remove the first and second process gases 201 and 202 remaining in the process chamber 100 after the thin film is completely deposited and thus supply of the first and second process gases 201 and 202 is stopped.

The purging and/or pumping operation may be performed by the purge gas sprayer and the exhaust pumps 301 of the substrate processing apparatus 1.

In an embodiment of the present invention, for time-division ALD, the supplying of the second process gas 202 to the exhaust lines 302 may be performed during the purging and/or pumping operation.

The substrate processing method according to an embodiment of the present invention may be an ALD method using plasma.

Accordingly, the unit cycle may further include a third operation for generating plasma of the second process gas 202.

For example, the unit cycle may further include the third operation for generating plasma of the second process gas 202, and the third operation may be performed simultaneously with or sequentially to the second operation. In this case, the generated plasma may be pulsed plasma or direct plasma.

In the above description, the term [pulsed plasma] refers to a plasma implementation method for repeatedly applying sub pulse power with a pause during the third operation for generating plasma, and the term [direct plasma] refers to a plasma implementation method for applying the plasma without a pause during the third operation for generating plasma. The plasma may be generated by, for example, a plasma generating apparatus, and the configuration and structure of the plasma generating apparatus are disclosed in KR 2016-0062487, etc. The plasma generating apparatus may be, for example, provided inside or outside the process chamber 100 or combined with the process chamber 100. For example, the plasma generating apparatus may be provided together with a reaction gas supplier for supplying a reaction gas.

The depositing of the thin film may be performed based on a space-division or time-division deposition method, and a time, etc. for supplying the second process gas 202 to the exhaust lines 302 may vary based on the thin film deposition method.

For example, the supplying of the second process gas 202 may be performed in an operation other than the depositing of the thin film.

For example, the depositing of the thin film may be performed based on the space-division deposition method and, when the reaction gas generator 400 of the substrate processing apparatus 1 is configured as the first reaction gas generator, the supplying of the second process gas 202 may be performed in an operation other than the depositing of the thin film.

Specifically, when the space-division substrate processing apparatus 1 including only the first reaction gas generator is used, the supplying of the second process gas 202 to the exhaust lines 302 and, more particularly, the first exhaust line 302a may be performed in an operation other than the depositing of the thin film, for example, in the stabilizing of the process condition or loading or unloading of the substrate 102.

As described above, the time for supplying the second process gas 202 to the exhaust lines 302 is controlled to prevent non-uniform supply of the second process gas 202 into the process chamber 100 and non-uniform deposition of a thin film due to unstable providing of the second process gas 202 supplied from the first reaction gas generator separately to the first exhaust line 302a and the second process gas sprayer 200b. The time for supplying the second process gas 202 to the exhaust lines 302 may be controlled by, for example, the controller of the substrate processing apparatus 1.

When the reaction gas generator 400 includes at least two reaction gas generators 400, the supplying of the second process gas 202 to the exhaust lines 302 may be continuously performed during the other operations. In this case, as described above, the first reaction gas generator may supply the second process gas 202 to the first exhaust line 302a through the first supply line, and the second reaction gas generator may supply the second process gas 202 to the second process gas sprayer 200b through the second supply line.

In the time-division substrate processing method, the supplying of the second process gas 202 to the exhaust lines 302 may be continuously performed during each process because unstable supply of the second process gas 202 into the process chamber 100 and non-uniform thickness of the thin film may be caused in the time-division method for supplying the second process gas 202 from one reaction gas generator 400 separately to two or more parts.

That is, when the depositing of the thin film is performed based on the time-division deposition method, the supplying of the second process gas 202 to the exhaust lines 302 of the substrate processing apparatus 1 may be continuously performed during the above operations. In this case, the substrate processing apparatus 1 may include at least two reaction gas generators 400.

A substrate processing apparatus and a substrate processing method using the same according to an embodiment of the present invention may effectively prevent deposition of a first process gas including a reactive-metal-containing precursor, in an exhaust line for discharging the first process gas. As such, ultimately, problems due to a closed exhaust line, e.g., pump overload and frequent replacement of a pump line, may be prevented.

However, the scope of the present invention is not limited to the above effects.

While the present invention has been particularly shown and described with reference to embodiments thereof, it will be understood by one of ordinary skill in the art that various changes in form and details may be made therein without departing from the spirit and scope of the present invention as defined by the following claims.

What is claimed is:

1. A substrate processing apparatus comprising:
   a process chamber in which a process space is provided and comprising a susceptor on which at least one substrate is placed;
   a process gas sprayer for providing a first process gas comprising a reactive-metal-containing precursor and a second process gas comprising a reactive gas reacting with the first process gas, onto the substrate;
   an exhauster comprising one or more exhaust lines connected to exhaust pumps provided outside the process chamber to discharge the first and second process gases remaining in the process chamber; and
   a reaction gas generator for supplying the second process gas to the process gas sprayer and supplying the second process gas to at least one of the one or more exhaust lines to prevent deposition of the first process gas in the one or more exhaust lines,
   wherein the second process gas is supplied to a location upstream from at least one of the exhaust pumps,
   wherein the susceptor is configured such that a plurality of substrates are placed on the susceptor and rotates relatively to the process gas sprayer, wherein the process gas sprayer is configured as a process gas sprayer assembly comprising a first process gas sprayer for providing the first process gas onto the plurality of substrates and a second process gas sprayer for providing the second process gas, wherein the exhauster comprises a first exhaust line provided below a first process gas spray area and connected to a first exhaust pump provided outside the process chamber to discharge the first process gas, and a second exhaust line provided below a second process gas spray area and connected to a second exhaust pump provided outside the process chamber to discharge the second process gas, and wherein the reaction gas generator supplies the second process gas to the second process gas sprayer and supplies the second process gas to the first exhaust line to prevent deposition of the first process gas in the first exhaust line.

2. The apparatus of claim 1, wherein the first process gas comprises any gas selected from the group consisting of hafnium (Hf), zirconium (Zr), titanium (Ti), and tantalum (Ta).

3. The apparatus of claim 1, wherein the second process gas comprises ozone ($O_3$) gas.

4. The apparatus of claim 1, wherein the reaction gas generator comprises:

a first supply line for supplying the second process gas to the process gas sprayer; and a second supply line for supplying the second process gas to the exhaust lines.

5. The apparatus of claim 1, wherein the reaction gas generator comprises:

a first reaction gas generator for supplying the second process gas to the process gas sprayer; and a second reaction gas generator for supplying the second process gas to the exhaust lines.

6. The apparatus of claim 1, further comprising:

a controller for controlling a supply condition comprising a time and content for providing the second process gas supplied from the reaction gas generator, into the exhaust lines, based on a process condition.

7. A substrate processing method using the substrate processing apparatus of claim 1, the method comprising the steps of:

depositing a thin film using the first process gas comprising a reactive-metal-containing precursor and the second process gas comprising a reactive gas reacting with the first process gas; and supplying the second process gas to at least one of the exhaust lines of the substrate processing apparatus.

8. The method of claim 7, wherein the depositing of the thin film comprises stabilizing a process condition, and wherein the supplying of the second process gas comprises supplying the second process gas to at least one of the exhaust lines during the stabilizing of the process condition.

9. The method of claim 7, wherein the depositing of the thin film comprises at least one unit cycle comprising:

a first operation for providing the first process gas onto the substrate; and a second operation for providing the second process gas onto the substrate.

10. The method of claim 9, wherein the unit cycle further comprises a purging and/or pumping operation for removing the first and second process gases remaining in the process chamber, and wherein the supplying of the second process gas comprises supplying the second process gas to at least one of the exhaust lines during the purging and/or pumping operation.

11. The method of claim 7, wherein the supplying of the second process gas is performed in an operation other than the depositing of the thin film.

\* \* \* \* \*